Sept. 26, 1967 T. S. TE VELDE ET AL 3,343,254

METHOD OF NARROWLY SPACING ELECTRICALLY CONDUCTIVE LAYERS

Filed Feb. 20, 1964

INVENTORS
Ties S. te Velde.
Gertruda W.M Th. van Helden.
BY
Frank R. Jifani [signature]
AGENT United States Patent Office 3,343,254

Patented Sept. 26, 1967

3,343,254

METHOD OF NARROWLY SPACING ELECTRICALLY CONDUCTIVE LAYERS

Ties Siebolt te Velde and Gertruda Wilhelmina Maria Theresia van Helden, Emmasingel, Eindhoven, Netherlands, assignors to North American Philips Company, Inc., New York, N.Y., a corporation of Delaware Filed Feb. 20, 1964, Ser. No. 346,172

Claims priority, application Netherlands, Sept. 25, 1963, 298,353

9 Claims. (Cl. 29—572)

ABSTRACT OF THE DISCLOSURE

A method for providing a narrow gap between electrically conductive layers by overlapping the layers, and then causing by means of a heat treatment one of the layers or its support to getter the contiguous portion of the other layer producing the gap in between.

This invention relates to methods of providing at least two surface layers side by side on a carrier, more particularly electrically conductive layers separated from each other by a gap, preferably for the manufacture of semiconductor devices comprising at least two electrode layers. The invention also relates to carriers comprising at least two surface layers which are relatively separated by a gap and manufactured by the use of the invention, as well as to semiconductor devices comprising at least two electrode layers separated by a gap and manufactured by the use of the method according to the invention.

Providing such surface layers, separated by a gap, on a carrier is an operation which frequently occurs in numerous branches of engineering, for example in the manufacture of electronic switching elements, especially if such elements are manufactured in miniature type or built up with the aid of a conductive electrode pattern to form a complex circuit on a carrier. This method is especially important inter alia in semiconductor technique where microminiaturisation is an important subject and where the dimensions of the gap are often also determinative of the operation of the semi conductor device. In photo-electric cells, for example, the width of the gap between the two electrode layers is also a measure of the sensitivity and, for example, in field-effect transistors the width of the gap between the source and drain electrode layers is also determinative of the amplification factor and the frequency response. The width of gap desired for such uses is often small, for example, less than 100$\mu$ or even less than 10$\mu$. Such small widths of gap are also frequently desirable for the relative electrical insulation of two electrode layers, for example in field-effect transistors in which the gate electrode layer must be provided, for example, between a source electrode layer and a drain electrode layer on one side of a carrier and must be separated from the other electrodes, for example, by a narrow gap.

It is common practice to apply such surface layers, which often constitute complicated electrode patterns, on a carrier by means of evaporation or by the use of photographic or electrodeposition techniques, during which process masks are used to obtain the desired gap between the electrodes. The said technique becomes very complicated especially for small widths of the gap, because the spacing between the mask and the carrier must be smaller than the width of the gap for a high degree of accuracy. Also the problem arises that, if the dimensions of the gap are even smaller, even though the masks are adjusted accurately, the electrode material spreads along the surface of the carrier also under the mask. Thus, for example, in the case of deposition by evaporation, the atoms of the electrode material upon reaching the carrier have a certain velocity at which they can also spread along the surface of the carrier under the mask. For these reasons it is in practice already very difficult, for example, in the bulk manufacture of photoelectric resistances to obtain distances between the electrodes which are smaller than, say, 100 microns. This problem becomes more severe and the required techniques become more complicated as the desired width of the gap decreases.

An object of the invention is inter alia to provide a completely novel method by which two or more surface layers separated by a gap may be provided on a carrier in a comparatively simple manner and which is especially suitable for obtaining widths of gap which are from small to very small, for example, from a few hundred microns to even one micron.

According to the invention, for providing at least two surface layers side by side on a carrier, more particularly electrically conductive layers which are separated from one another by a gap, at least two surface layers consisting, at least in part, of different materials at least near the gap to be formed, are provided on two regions of the carrier which are substantially contiguous to each other or partly overlap, and a gap is formed between the two surface layers due to material of at least one surface layer on one of the regions being absorbed, near the edge of the other region, by an adjacent portion of the carrier and/or of the other surface layer.

The invention is thus based inter alia on the recognition that by suitable choice of the materials of the carrier and the surface layers, if desired with simultaneous heating or passage of current, it is found possible for the material of one surface layer, due to a gettering action of the other surface layer or due to a combined gettering action of the carrier and the other surface layer, to be selectively removed to a high extent from the surface at the edge of the other surface layer over some distance, which determines the width of the gap, in a manner such that the two surface layers may be electrically insulated from each other to a high extent. It has been found that there are many electrode materials and carrier materials even among those usually employed which, when chosen in the correct combination, can be used for the formation of a gap in the manner above described. In the method according to the invention, to provide two surface layers separated by a gap, it is not necessary to apply the two layers exactly at the desired distance from each other, as is the case in the known method. It is sufficient when such layers are applied so that they overlap or are contiguous to each other at least substantially, while the gap is formed either spontaneously already during the provision of the layers or in a process which is accurately controllable by the period of heating or passage of current with the use of the gettering action. The property that the atoms of the surface layers can diffuse along the surface of the carrier, in contrast with the known method in which this property interferes with the formation of small widths of the gap, is used with advantage in the method according to the invention to determine, together with the gettering action, the width of the gap.

In one preferred embodiment of the method according to the invention, the gap is formed in the material of one surface layer by absorption by the other surface layer, the materials of the surface layers being chosen, at least near the gap to be formed, to be such that the said other surface layer has a gettering capacity for the material of the one surface layer. The material of the carrier is in this case not particularly important and need only be such that the two layers can readily be adhered thereto and that, at least after heating, it permits a surface diffusion of atoms of the surface layers for the formation of the gap.

The terms "gettering capacity" and "gettering action" are to be understood in the present application in such a wide sense as to mean the capacity of absorbing and retaining atoms of a material which arrive in the relevant layer due to diffusion or otherwise.

The gettering capacity of the surface layer may be based on a physical, physico-chemical or purely chemical binding of the atoms from the one material on the other surface layer, for example, on physical adsorption, or on the formation of alloys or chemical compounds. The material of the surface layer may itself have this gettering capacity, or the surface layer may acquire it after reaction with the material of the carrier or with the material of the one surface layer, resulting in, for example, compounds having a gettering action being formed.

In another suitable embodiment of the method according to the invention the gap is formed in that material of the one surface layer is absorbed by the carrier near the edge of the other surface layer, the other surface layer consisting, at least in part, of a substance which enhances absorption of the material of the one surface layer by the carrier. A selective formation of the gap may thus occur at the edge of the other surface layer and at some distance therefrom (due to the said substance being spread). Thus it has already been found possible, for example, to form in this manner a gap on a substrate consisting of an evaporation-depositited chalcogenide, as cadmium sulphide, by adding to the other surface layer a substance which enhances the recrystallisation of the carrier layer, while during this recrystallisation the one material is at the same time absorbed by the recrystallizing substrate near the edge of the other layer. In the case of cadmium sulphide and zinc sulphide as a carrier layer, silver and copper, for example, are found to have the said property at temperatures higher than 500° C. and 600° C. respectively, while several organic compounds such as, for example, those used in a silver paste, or phthalate resins, or silicon oils are also found, in co-action with copper or silver, to be suitable for this purpose already at lower temperatures, for example, 300° C.

In certain cases, for example in the case of copper and indium on cadmium sulphide, after evaporation-deposition of copper and then of indium, a gap may in practice be formed at the edge of the copper, during the deposition of indium, at a low temperature, for example at 20° C. This is connected inter alia with the fact that indium already has a considerable rate of diffusion along the surface at the said temperature. However, the gap is preferably formed, as is also necessary in the majority of cases, after the surface layers are provided on the carrier, by means of a thermal treatment. The rise in temperature resulting from such thermal treatment causes inter alia an increase in the rate of diffusion of the atoms from the one surface layer along the surface of the carrier and may also add to an increase in the gettering capacity of the carrier and of the other surface layer. The duration and the temperature are then also highly determinative of the width of the gap to be formed. In the case of gettering action of the other surface layer the material of the other surface layer is preferably chosen so that its atoms have a considerably lower rate of surface diffusion for the given heating treatment and hence cannot substantially interfere with the formation of the gap. In the case of gettering action of the carrier, the surface diffusion of the other layer is not or at least less objectionable since this material may also be absorbed by the carrier, for example during recrystallisation.

Especially in the case of a greater getter action of the other surface layer or of the carrier, heating of the assembly to a higher temperature may in itself already give rise to the formation of a gap which could already be used advantageously for several applications. However, a very favourable formation of the gap is obtained if, as is preferably the case, during the formation of the gap means are used for locally increasing on the carrier the rate of surface diffusion of the atoms from the one layer near the edge where the gap will be formed, preferably by means of a local increase in temperature near the said edge. To this end, an electric current is passed through the surface layers, which passes the edge, preferably at least during part of the gap-forming treatment, more particularly at least during the final part thereof. The heat dissipation will concentrate more and more at the edge and cause in situ an additional increase in temperature according as the formation of the gap proceeds and the edge becomes thinner. Such local increase in temperature gives rise to a local increase in the rate of surface diffusion and may also bring about a local increase in the getter action, for example of the carrier. The local increase in the rate of surface diffusion implies an increased discharge to the area of gettering, which is greater than the supply from and through the one layer, so that a stronger formation of the gap occurs. The local dissipation of heat may be increased further and concentrated more locally by using a pulsatory current.

Although the gap is preferably always formed with the use of passage of current it has also been found possible in an efficacious manner to obtain a local increase in the rate of surface diffusion near the edge by choosing the materials of the one layer and of the carrier to be such that the rate of surface diffusion of the atoms from the one layer over the carrier is considerably higher than over the one surface layer itself. After the one surface layer has already becomes considerably thinner near the edge due to the gettering action of the other surface layer, the atoms of the one surface layer will always acquire in situ a higher rate of surface diffusion since they will travel more and more over the material of the carrier surface, which also implies a locally increased rate of discharge and hence a stronger formation of the gap.

Although an increase in temperature of the whole and also a selective increase in temperature by supply of current may be used for the formation of a gap independently of one another, a combination of both is preferably used in the sense that, during the passage of current, an increase in temperature of the whole is also used. The increase in temperature of the whole may then serve to increase in part the rate of surface diffusion and also, for example, to increase the gettering action, while the passage of current causes both to be selectively increased near the edge still further to the desired values.

The other surface layer, which has itself a gettering capacity or enhances the gettering capacity of the carrier, is preferably made thicker, at least near the edge, than the one surface layer. The gettering capacity of the other surface layer is thus increased and it is also possible, if desired, to prevent the other surface layer itself from being completely absorbed, for example, by the carrier. The edge of the other surface layer may thus be used in determining the position of the gap. However, without passing beyond the scope of the invention, it is also possible, if the gettering capacity of the other surface layer is high enough, to make the two layers equally thick or, if desired, to make the other layer thinner than the one layer.

Although the invention may in general advantageously be used for providing surface layers separated by a gap, it is yet of special interest for providing electrically conducting layers, separated by the gap, which may be electrically insulated from each other by means of the gap. Notably the invention is especially important for the manufacture of devices, more particularly semiconductor devices, in which the surface layers constitute two or more electrode layers of the device, for example, for resistances, photoelectric resistances and field-effect transistors in which the separation of the electrode layers by a thin gap is very important. The medium active for the device, for example the semiconductor or photoconductor or resistance layer, may itself be provided as the carrier layer to which electrode layers are applied. By using the invention it is also possible first to provide the electrode layers on an insulating carrier and then to provide the active medium, for example, the semiconductor on the electrode pattern. Although in the method according to the invention, electrically conductive, semi-conductive and insulating carriers may be used when the gap is formed without a passage of current, it is preferable in the case of a passage of current during the formation of the gap to use a carrier of semi-conductive, for example photoconductive, or insulating material which has a considerably higher resistance than have the electrode layers, in order to concentrate the current in the said layers.

In order that the invention may be readily carried into effect, the method according thereto, together with special embodiments thereof for the manufacture of semiconductor devices, will now be explained in detail, by way of example, with reference to the accompanying diagrammatic drawing, in which.

Hereinafter at first the method according to the invention, more particularly the formation of a gap, will be explained more fully in a more general sense with various materials without referring to a specific use and then a few embodiments will be briefly explained, by way of example, which utilize the method according to the invention for the manufacture of semiconductor devices.

Figure 1:
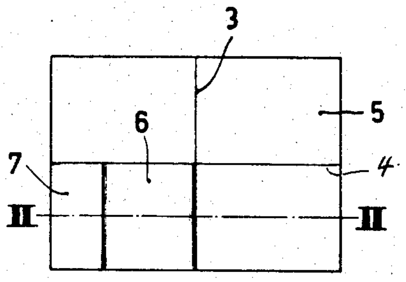
FIGURES 1 and 2 are a plan view and a cross-sectional view, respectively, of a carrier provided with surface layers during the first stage of the method according to the invention.
Figure 3:
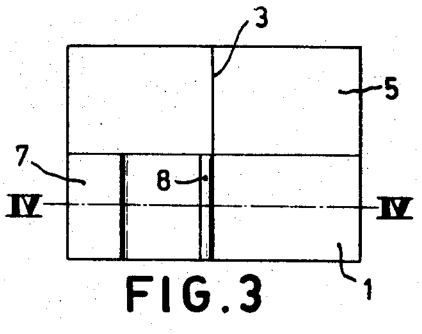
FIGURES 3 and 4 are a plan view and a cross-sectional view, respectively, of a later stage of the same carrier with surface layers after the gap has been formed.
Figure 2:
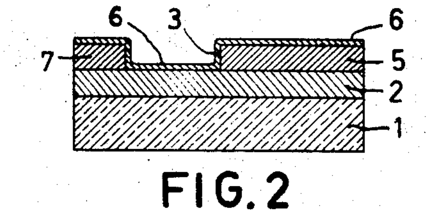
Figure 4:
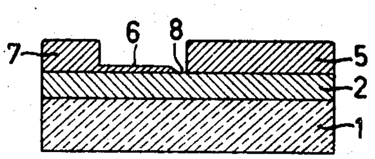

In the investigation about the possibilities of use of various materials in the method according to the invention start is always made, for the sake of simplicity, from the same configuration of the carrier and surface layers as that shown in plan view and in cross-section, respectively, in FIGURES 1 and 2 after the surface layers are provided and in FIGURES 3 and 4 after the gap is formed. Start is always made from a carrier comprising a rectangular glass plate 1 and a cadmium-sulphide layer 2, of say, 2$\mu$ thick which is deposited on the upper side thereof by evaporation (FIGURE 2).

The two surface layers between which a gap will be formed are provided on the CdS layer 2 which thus constitutes the carrier for the said surface layers. The half of the carrier surface located to the right of the line 3 (see (FIGURE 1) is always covered with a surface layer 5 which has a gettering action or consists, at least in part, of a material which enhances the gettering action for the material of the one layer into the substrate. The layer 5 in these examples is always made comparatively thick, for example 0.1$\mu$.

The half of the carrier surface located below the line 4 is always covered with a considerably thinner layer 6 of the one material which layer 6 thus overlaps the other layer 5 in the quadrant (5, 6) bounded by the lines 3 and 4. The gap will be formed at the edge 3 of the surface layer 5. To simplify the supply of current to the layer 6 this layer is locally formed with a thicker portion 7, for example of the same material as that of the layer 6, which may be applied to the carrier previously or afterwards. The dimensions of the carrier surface are for example, 2 cm. x 2 cm.

In the examples following hereinafter, the electrode layers are always evaporation-deposited in vacuo and the thermal treatment is carried out in a substantially inert atmosphere, for example argon. The thicknesses of the various layers and the widths of the gaps are shown with exaggerated dimensions in the figures for the sake of clarity.

By way of example, with the use of the above-mentioned configuration, the following combinations of materials for the layers 5 and 6 are used in the method according to the invention to form a gap at the edge 3.

*Example I*

A surface layer 5 of aluminum which is about 0.1$\mu$ thick, is first evaporation-deposited and then a surface layer 6 of antimony which is about 100 A. thick. The aluminum has, more particularly in the molten state, a gettering action for antimony at least at a high temperature, which action is probably due to the formation of aluminum antimony compounds.

After heating of the whole in an oven at about 700° C. for 10 minutes a gap 8 had been formed at the edge 3 of the layer (5, 6) in the manner shown in FIGURES 3 and 4, in which elements corresponding to those of FIGURES 1 and 2 are indicated by the same reference numerals. The width of the gap, which is dependent upon temperature and duration, is for example 50$\mu$. The surface layers 5 and 6 are found to be well electrically insulated from each other by the gap 8. The formation of the gap is in this case also enhanced by the fact that the rate of surface diffusion of the antimony over the CdS surface is evidently considerably higher than over the antimony surface. The aluminum does not substantially diffuse over the CdS surface at the said temperatures. Instead of the aforementioned thermal treatment, it is also possible to use with advantage a combination of heating at a lower temperature with simultaneous passage of current and consequent selective heating.

*Example II*

A surface layer 5 of copper, which is about 0.1$\mu$ thick, is first evaporation-deposited and then a surface layer 6 of indium which is about 100 A. thick.

After the evaporation-deposition, during which process the carrier (1, 2) was substantially at room temperature, a gap 8 of about 100$\mu$ wide was found to be already formed between the layers 5 and 6 at the edge 3 in the manner shown in FIGURES 3 and 4. The gap 8 is formed due to the gettering action of the copper and due to the high rate of surface diffusion of the indium over the CdS surface at the said low temperature.

*Example III*

A surface layer 5 of tellurium, which is for example 0.1$\mu$ thick, is first evaporation-deposited and then a surface layer 6 of indium which is, for example, 100$\mu$ thick.

After the evaporation-deposition, a certain amount of gap formation can already be ascertained under a microscope. By passage of current or heating to a temperature from 200° C. to 300° C. a distinct gap is formed due to the induim being removed from the edge 3 over some distance. The gettering action of the surface layer 6 is probably based on the formation of indium-tellurium compounds. In this case also the high rate of surface diffusion of the indium over the CdS surface plays a part, while the tellurium diffuses over the surface to a considerably lesser extent.

*Example IV*

A surface layer 5 of silver, which is about 0.1$\mu$ thick, is first evaporation-deposited and then a surface layer 6 of copper which is 50 A. thick.

After a thermal treatment at 300° C. for about 30 minutes a gap 8 has been formed in the manner shown in FIGURES 3 and 4. The gettering action of the silver and the rate of surface diffusion of the copper over the CdS surface, which is high at the said temperature and higher than that of silver, have added to the formulation of the gap.

The formation of the gap may be improved in that, during a thermal treatment in the oven at, for example, 200° C. an electric voltage is applied between the electrodes 7 and 5, resulting in a current of, for example, 50 ma. which enhances the rate of surface diffusion of the copper and the gettering action due to heat dissipation especially at the edge 3.

*Example V*

A layer 6 which is, for example, of copper and 50 A. thick, is first provided and then a surface layer 5 of silver paste (Leitsilber) which consists of an organic binder (among which are alkyd resins) which contains finely-divided silver. Said silver paste contains organic substances which bring about, in co-action with copper, the recrystallisation of the CdS layer at temperature of about 300° C. and during this recrystallisation the copper is also absorbed by the CdS, at least insofar the copper is present at the edge 3 near the said organic substances.

After a thermal treatment at 350° C. for 20 minutes, a gap 8 seems to have been formed a width of 10 microns and under a microscope it can be ascertained that the CdS layer was recrystallised in the gap 8 and otherwise also under the silver-paste layer 5. During this recrystallisation the copper has been removed at some distance from the edge 3.

The formation of a gap may also be obtained in a very efficacious manner by replacing the aforementioned thermal treatment by heating the whole to, for example, 200° C. and passing at the same time a current of, for example 10 ma. via the surface layers 5 and 7 through the layer 6 which current also passes the edge 3 where the gap is formed. The increased thermal dissipation near the edge 3 during the formation of the gap will selectively increase the rate of surface diffusion of the copper and also the recrystallizing and hence gettering action of the CdS layer at the gap being formed, thus assisting in an effective formation of the gap. In this case the gap 8 is found to be extremely narrow, of the order of 1 micron of even less, and the presence of the gap follows more particularly from the fact that, after the treatment, the resistance between the surface layers 5 and 6 has increased to 10 megohms whereas the resistance of the layers 5 and 6 outside the gap is substantially unchanged.

*Example VI*

A surface layer 5 of silver, which is 0.1$\mu$ thick, is first provided and then a surface layer 6 of gold which is 50 A. thick. Silver enchances the recrystallisation of the CdS layer at temperatures higher than about 500° C. and a gap 8 can be formed at the edge 3 of the silver layer 5 due to local absorption of gold upon heating at a high temperature, for example, with simultaneous passage of current.

After the formation of a gap with various materials has been explained in the foregoing examples, some possibilities of use for the method according to the invention for the manufacture of semiconductor devices, more particularly for the manufacture of a photoresistance cell and a field-effect transistor, will now be explained, by way of example, with reference to FIGURES 5 and 6.

Figure 5:
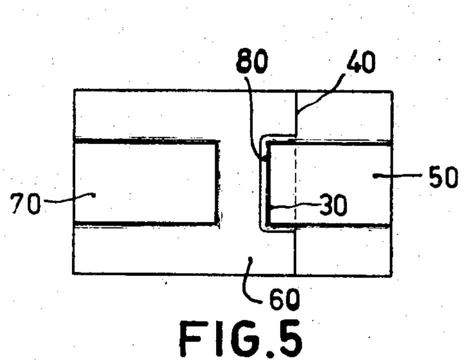
FIGURE 5 is a plan view of a photoelectric cell manufactured by the use of the method according to the invention.

FIGURE 5 shows, in a plan view on the carrier, a photo-electric cell having an electrode pattern as manufactured by the use of the invention. For the sake of clarity, parts which correspond in function to those of FIGURES 1 to 4 are indicated by reference numerals the first figure of which is the same as the refernce figure in FIGURES 1 to 4. In the manufacture it is possible to proceed as follows: the one thin surface layer 60, for example, is first evaporation-deposited so as to cover substantially the whole surface area of the carrier to the left of line 40. The carrier again comprises a glass plate covered with a thin superficial layer of evaporation-deposited photoconductive CdS. Next the other surface layer 50, which is preferably thicker than the one layer 60, is evaporation-deposited in the form of a strip which partly overlaps the one layer 60. This layer 50 consists of the material which has itself the gettering action or which can enhance the gettering action in the CdS layer at the edge 30. The gap 80 will be formed at the area where the edge 30 overlaps the one layer 60. The surface of the carrier may also be provided with an electrode layer 70 which consists, for example, of the same material as the layer 60 and is made thicker and can thus be used for the current supply in a simple manner. The layer 70 may be applied, for example, prior to the evaporation-deposition of the layer 60, but if desired also thereafter at a later stage.

The gap 80 may be formed at the edge 30 by the use of the invention, if desired with simultaneous passage of current, due to absorption of material from the layer 60 near the said edge by the CdS carrier layer or the other surface layer 50. The width of the gap 80 may thus be made very small, dependent on the choice of the materials, the duration and temperature of the heating process and the passage of current, so that a small distance between the electrode layers 60 and 50 is obtainable. The gap 80 constitutes the photosensitive portion of the photoelectric cell and the electrode layers (70, 60) constitute the one electrode and the electrode layer 50 the other electrode. It will be evident that other forms of these electrodes are also possible. Thus, for example, the layer 50 may be made comb-shaped and, due to the treatment according to the invention, the gap 80 will then also be formed along the comb-shaped edge of the layer 50 so that the electrode layers 60 and 50 will constitute an inter-digital electrode system.

Figure 6:
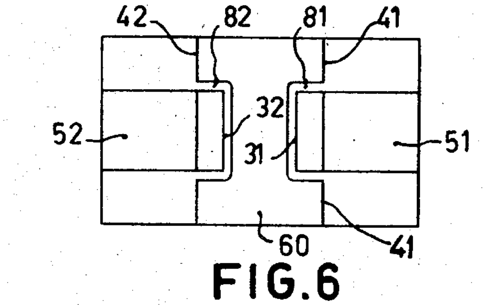
FIGURE 6 is a plan view of a field-effect transistor as manufactured by the use of the invention.

FIGURE 6 is a plan view of a field-effect transistor as manufactured by the use of the invention. The first figure of the reference numerals, as before, corresponds to those elements of FIGURES 1 to 4 which correspond in function. The carrier again comprises, for examples a glass plate on which a CdS layer is evaporation-deposited. Preferably two surface layers 51 and 52 are first evaporation-deposited on the carrier surface which layers afterwards constitute the ohmic source electrode and the ohmic drain electrode of the transistor. To this end, the said layers are made of a material which forms a substantially ohmic connection with the semiconductor layer, in this case the CdS layer. Next a further electrode layer 60 of another material is evaporation-deposited on the carrier surface between the lines 41 and 42 and this layer forms a rectifying connection with the CdS layer since it has to constitute afterwards the gate electrode of the transistor.

The material of the layers 51 and 52 and that of the layer 60 are also chosen so that the one material, for example that of the surface layers 51 and 52, has a gettering capacity for the other material or enhances the gettering action of the carrier for this other material. After heating, preferably by means of passage of current, the layer 60 is electrically insulated from the supply electrode 51 and the discharge electrode 52 due to the formation of gaps 81 and 82. When using passage of current the gaps 81 and 82 may be formed separately by first switching the current source between the layers 60 and 51 and then between the layers 60 and 52. However, it is also possible to switch the current source directly between the electrode layers 52 and 51 and thus to obtain the two gaps 81 and 82 in one operation.

In conclusion, it is to be noted that many further variations are possible in carrying out and practising the method according to the invention without passing beyond the scope of the invention. Thus, for example, other carrier materials and other materials for the surface layers can be used which relatively have the desired gettering action. The sequence of providing the surface layers 5 and 6 can in most cases also be reversed. The carrier can be built up of several layers, in which event especially the upper layer on which the surface layers are provided is determinative, as far as the rate of surface diffusion and the gettering action are concerned, of whether the carrier can consist completely of the same material. In certain cases it may be desirable first to provide the electrode pattern on an insulating carrier by using the invention and then to provide the semiconductor layer. The method according to the invention can also be used, for example, for providing electrode layers on each side of a pn-junction intersecting the surface of the carrier. The gettering surface layer may then be provided selectively in known manner by galvanic means on the n-side or on the p-side substantially up to the pn-junction, whereafter the one surface layer is evaporation-deposited onto the other side and may partly overlap the first surface layer. By using the invention, due to the gettering action of the first layer, a gap may be formed at the pn-junction separating the two electrode layers, in which event the development of heat in the pn-junction upon passage of current can also be utilized. By using pulsatory current, the selective heating at the area where the gap is being formed and hence the formation of the gap can be intensified. In the case of gettering action of the carrier, in certain cases materials for the one layer and the other layer can be used which differ only in that one of them contains a content of a substance which brings about the gettering capacity of the carrier. Although in the examples an inert atmosphere was used during the formation of a gap, it is conceivable that in certain cases admixtures of active gases may have a favourable influence on the formation of a gap or at least do not interfere with it.

What is claimed is:

1. A method for providing closely-spaced electrically-conductive layers on a carrier, comprising forming on a carrier divergently directed first and second layers of electrocally-conductive material, said layers being contiguous over at least one region where a gap is to be provided between the layer edges, said layers being of different composition at least in the vicinity of the gap, the material of said first layer when heated exhibiting a gettering capacity for the material of said second layer, and forming said gap between said layers at said one region by subjecting at least said first layer to a heat treatment of such thermal magnitude and of such duration as to cause the material of said first layer at said region to absorb the contiguous portion of said second layer.

2. A method as claimed in claim 1 wherein the material of said first layer is comprised of atoms exhibiting a surface diffusion rate which is considerably below that of the atoms in said second layer.

3. A method as claimed in claim 2 and including the step of locally increasing the temperature of said second layer at said region where the gap is provided to locally increase on the carrier the surface diffusion rate of atoms of said second layer.

4. A method as claimed in claim 3 wherein the local increase in temperature is obtained by passing an electric current through the layers and through the region where the gap is to be provided.

5. A method as set forth in claim 4 wherein the electric current used is a pulsatory current.

6. A method as set forth in claim 3 wherein the first layer is made thicker than the second layer.

7. A method as set forth in claim 1 wherein the first layer is deposited on one region of the carrier and the second layer is deposited on another region of the carrier with the edge of the second layer overlapping the first layer, the gap being formed at the overlapping portions.

8. A method for providing closely-spaced electrically-conductive layers on a carrier, comprising forming on a carrier divergently directed first and second layers of electrically-conductive material, said layers being contiguous and in contact with the carrier over at least one region where a gap is to be provided between the layer edges, said layers being of different composition at least in the vicinity of the gap, the material of said carrier when heated while in contact with one of the first and second layers exhibiting a gettering capacity for the material of the other of said first and second layers, and forming said gap between said layers at said one region by subjecting said carrier and said layers to a heat treatment of such thermal magnitude and of such duration as to cause the material of said carrier at said region to absorb the contiguous portion of said other layer.

9. A method as set for in claim 8 wherein said one layer contains a substance which has the property of enhancing recrystallization of the carrier.

References Cited

UNITED STATES PATENTS

| | | | |
|---|---|---|---|
| 2,911,539 | 11/1959 | Tanenbaum | 148—187 X |
| 3,215,570 | 11/1965 | Andrews | 148—187 |

WILLIAM I. BROOKS, *Primary Examiner.*